United States Patent [19]

Knauer

[11] 4,244,035
[45] Jan. 6, 1981

[54] HIGHLY INTEGRATED DYNAMIC MEMORY ELEMENT

[75] Inventor: Karl Knauer, Kirchseeon, Fed. Rep. of Germany

[73] Assignee: Siemens Aktiengesellschaft, Berlin and Munich, Fed. Rep. of Germany

[21] Appl. No.: 69,177

[22] Filed: Aug. 23, 1979

[30] Foreign Application Priority Data

Sep. 29, 1978 [DE] Fed. Rep. of Germany ....... 2842588

[51] Int. Cl.³ ............................................. G11C 11/24
[52] U.S. Cl. .................................... 365/149; 365/174; 307/303; 357/51
[58] Field of Search ............... 365/149, 174, 181, 182, 365/189; 307/238, 279, 303; 357/51

[56] References Cited

U.S. PATENT DOCUMENTS 4,064,491 12/1977 Knauer et al. ....................... 365/149

Primary Examiner—Terrell W. Fears
Attorney, Agent, or Firm—Hill, Van Santen, Steadman, Chiara & Simpson

[57] ABSTRACT

A dynamic element is disclosed which is constructed on a doped semiconductor substrate. A strip-shaped semiconductor region, which is on a surface of the substrate and which is doped opposite to the substrate, is designed as a first selection line, whereas a path which is separated by means of an insulating layer from the substrate, and which runs cross-wise to the strip-shaped region, represents a second selection line. The path is separated from a substrate region which lies next to the strip-shaped region by means of a thin film region of the insulating layer. In the case of memory elements of this type, simple construction and small dimensions are desired. According to the invention, this is achieved in that inside of the strip-shaped region, an island-shaped semiconductor region doped opposite to the strip-shaped region is arranged and which lies close to an interface of the strip-shaped region separating it from the semiconductor region which lies under the thin film region. The invention is useful in digital semiconductor memories of high bit density.

6 Claims, 12 Drawing Figures

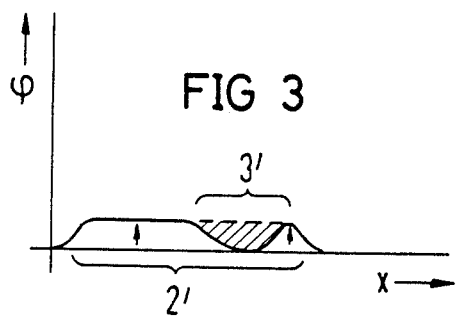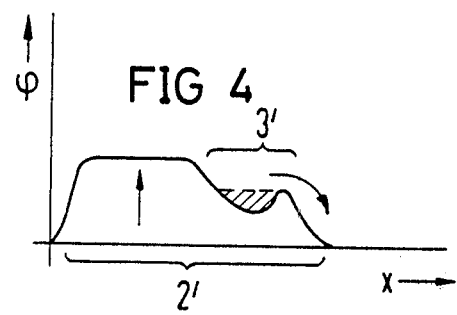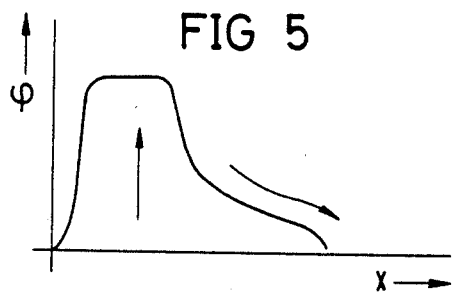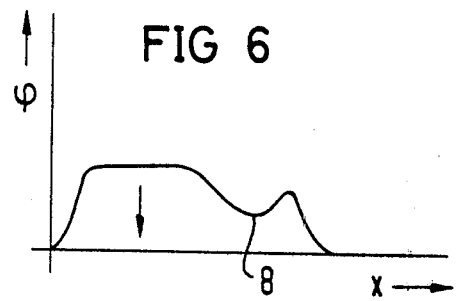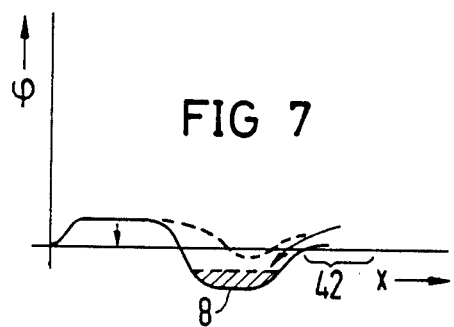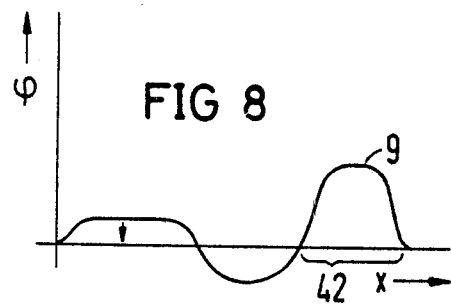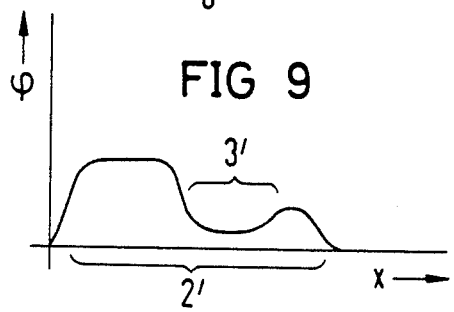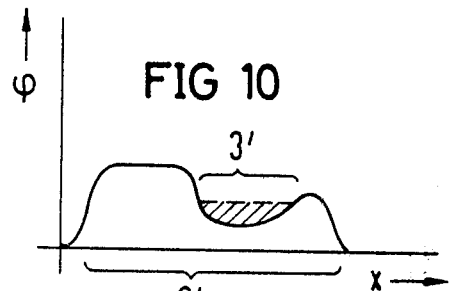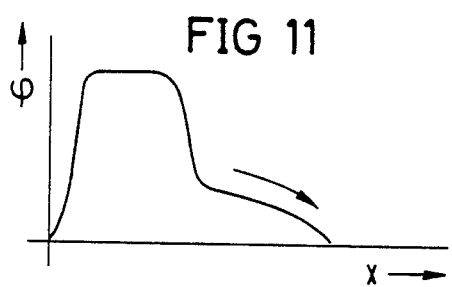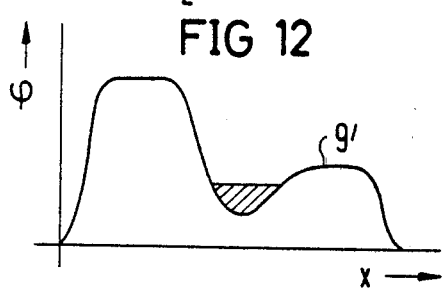

HIGHLY INTEGRATED DYNAMIC MEMORY ELEMENT

BACKGROUND OF THE INVENTION

The invention concerns a dynamic memory element formed with a doped semiconductor substrate with an insulating layer covering a surface of the substrate. The insulating layer has thick film regions and thin film regions. A strip-shaped semiconductor region in the substrate doped opposite to the substrate and which forms a first selection line for the memory element running parallel to a surface of the substrate. A conducting path is provided as a second selection line for the memory element which is arranged on the insulating layer and which runs cross-wise to the first selection line. The path is separated from a portion of the substrate lying adjacent the strip-shaped semiconductor region by the thin film region.

SUMMARY OF THE INVENTION

It is an object of this invention to provide a memory element of the above type with dimensions which are as small as possible and with simple construction. This problem is solved by providing a memory element having an island-shaped semiconductor region within the strip-shaped semiconductor region and which is doped opposite to the strip-shaped region. The island-shaped region is more closely located to an interface of the strip-shaped semiconductor region and the portion of the substrate lying underneath the thin film region than it is to an opposite interface of the strip-shaped semiconductor region. The invention also concerns a method for operating a memory element of the above described type.

With the invention, the construction of the memory element is very simple and is particularly suited for a highly integrated arrangement of a plurality of memory elements in the framework of a memory matrix.

BRIEF DESCRIPTION OF THE DRAWINGS

FIGS. 3–12 show potential differences in the memory element according to FIG. 1 in the case of different operating conditions.

DESCRIPTION OF THE PREFERRED EMBODIMENTS

Figure 1:
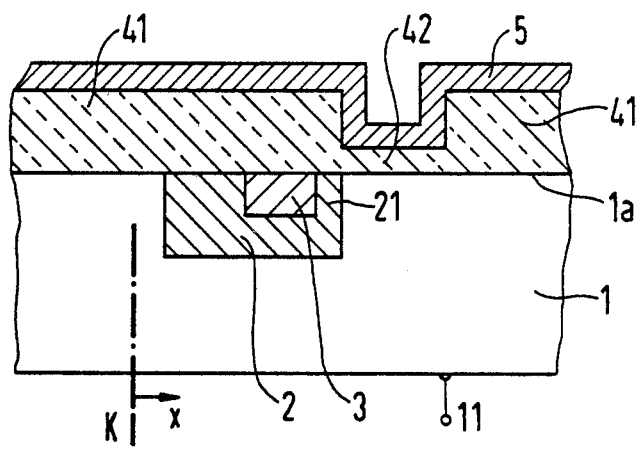
FIG. 1 shows a cross-section through a memory element according to the invention.

FIG. 1 illustrates a semiconductor substrate upon which a memory element designed according to the invention is constructed. The substrate consists, for example, of p-doped silicon and has a substrate connection 11. At the periphery 1a of the substrate 1 there is located a redoped, strip-shaped semiconductor region 2, which in the present case is n-doped. This n-doped region extends vertically relative to the drawing FIG. 2 through the substrate 1 and represents a first selection line of the memory element according to the invention. In region 2, and as shown in FIG. 1, a p-doped, island-shaped region 3 is provided. There, the region 3 is arranged in the region 2 such that it is in close proximity with the right perimeter of region 2 shown in FIG. 1. The distance between the two perimeters amounts, for example, to approximately 0.5 $\mu$m. Upon the semiconductor substrate 1, the n-doped area 2 and the p-doped area 3, there is an insulating layer which consists preferably of silicon dioxide. This insulating layer contains a thin film region 42 above a semiconductor area which is laterally adjacent the n-doped region 2. The remaining regions of the insulating layer are designed as thick film regions 41. For example, the thickness of the thin film region 42 amounts to approximately 60 nm, and the thickness of the thick film region 41 amounts to approximately 0.6 $\mu$m. Upon the insulating layer 41, 42 there is a path 5 as a second selection line which preferably consists of aluminum. The depth of region 2 can be 2 $\mu$m, and the depth of region 3 1 $\mu$m. The width of region 2 is, for example, 10 $\mu$m, and the width of region 3 approximately 3 to 5 $\mu$m.

Figure 2:
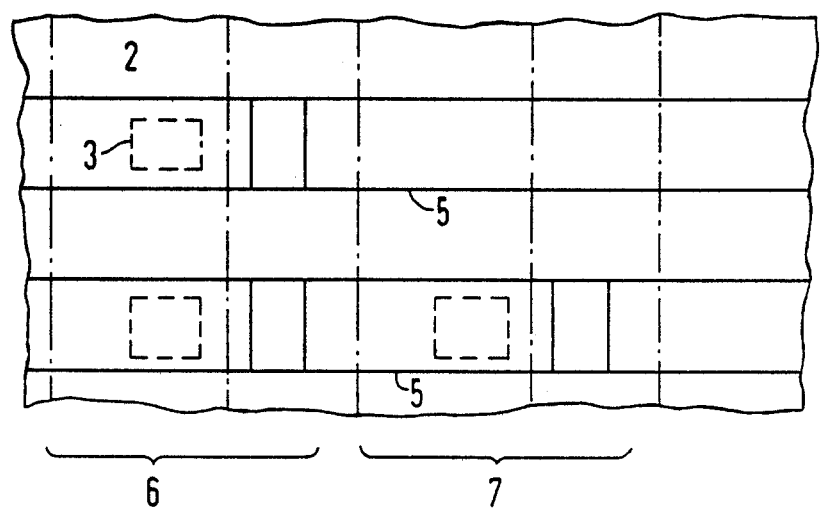
FIG. 2 is a top view of the memory element according to FIG. 1.

In FIG. 2, a top view of the arrangement according to FIG. 1 is represented. Details of FIG. 1 which were already specified bear the same reference symbols in FIG. 2. A path which is defined with a dot-dash pattern represents the strip shaped region 2, as a first selection line, and which runs vertically in FIG. 2. Surfaces which are surrounded with a broken line define regions 3. Surfaces which are surrounded by a solid line represent paths 5, which represent second selection lines. In FIG. 2, the second memory element 6 is represented, which, corresponding to the memory element represented in FIG. 1, is connected with one and the same first selection line 2. A third memory element which is arranged to the right near the second element 6 is designated 7 in FIG. 2.

FIGS. 3–14 illustrate several operating methods for the memory element according to the invention. First, by means of applying a positive bias voltage to the strip-shaped semiconductor regions 2, this is depleted with respect to majority carriers. In FIG. 3, the potential relationships which accordingly arise are represented. There, $\phi$ represents the surface potential at periphery 1a and x is the distance in FIG. 1 from a dot—dash reference line K. With 2' and 3', the widths measured in direction X of areas 2 and 3 are designated. As long as there are majority carriers present in the partial region 21 of the n-doped region 2, the potential $\phi$ of region 2 is raised uniformly, which is indicated in FIG. 3 by two arrows. If there are no longer any carriers in the thin region 21, and if the potential of region 2 is further raised, then there arises a voltage drop between the partial regions of region 2 which lie to the left and right of region 3 (FIG. 4). Now, charge can drain out of the p-doped region 3 into the substrate 1. This process is continued until no longer any charge is contained in the p-region 3. This state is represented in FIG. 5. If now the potential of n-region 2, or, respectively, of the first selection line is again lowered, the in p-region 3 a potential trough 8 forms (FIG. 6).

If one lowers the potential in the n-region 2 corresponding to FIG. 7 to a sufficient degree, then by means of the potential trough 8, charge from the substrate 1 is drawn via the partial region 21 into the p-region 3. In order to permit this charge input to proceed only in the case of writing-in of a first logic state, for example "0", but not in the case of writing-in a second logic state, for example, "1", in the earlier case (FIG. 7) a small positive voltage is applied to path 5 which does not permit a potential barrier to arise underneath regions 42. In the latter case, a larger positive voltage is applied which generates a potential barrier 9 (FIG. 8). Following this, region 2 is placed at a positive potential such that on the one hand no charge is drawn out of the substrate 1 into the empty p-region 3, (FIG. 9), or that on the other hand, no charge can drain out of the p-region 3 which is covered with charge (FIG. 10). Accordingly, the write-in process of a memory element ends.

In the case of read-out, several possibilities are to be illustrated. First, a process is specified which is used in order to read out an individual element from a plurality of elements which are combined by line and by column. In a matrix which is formed in this fashion, a positive voltage is applied to all paths 5, except for path 5 which is arranged over the element to be read out. Then the voltage of the associated region 2 is raised. If there is charge in the relevant p-region 3, then this drains into the substrate 1 (FIG. 11). The charges of all other islands 3 of the same region 2 are prevented from draining by means of the potential barrier 9', which is produced by the paths 5 (FIG. 12). The charge which is flowing out can now be determined at the substrate contact 11, as is known for CID-arrangements.

Another procedure for read-out of the stored information is by evaluating the current at the relevant first selection line. If charge was stored in the p-region 3, then a corresponding charge is present in the strip-shaped region 2 which is also released in the read-out. At the first selection line there accordingly arises a current signal which can be evaluated in known manner. With this technique, all of the first selection lines of a plurality of memory elements which are arranged in a line can be evaluated at the same time. This corresponds to a simultaneous read-out of all memory elements of this line.

If one chooses the width of region 2, the width of region 42 shown in FIG. 1, the width of paths 5, and a mutual spacing of the paths 5 at 5 μm, a surface requirement of approximately 51 (μm)² results for the memory elements.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A dynamic memory element system with at least one memory element, comprising: a doped semiconductor substrate having a surface and also a substrate connection; an insulating layer covering the surface of the substrate; the insulating layer having a thick film region and thin film region; a strip-shaped semiconductor region in the substrate doped opposite to the substrate and which is a first selection line running parallel to the surface; a conducting path as a second selection line arranged on the insulating layer and which runs crosswise to the first selection line, the path being separated from a portion of the substrate lying adjacent the strip-shaped semiconductor region by said thin film region; within the strip-shaped semiconductor region an island-shaped semiconductor region doped opposite to the strip-shaped region, the island-shaped region being more closely located to an interface of the strip-shaped semiconductor region and the portion of the substrate lying underneath the thin film region than to an opposite interface of the strip-shaped semiconductor region.

2. A memory element system according to claim 1 wherein a plurality of said memory elements are arranged together with memory elements of the same kind in lines and columns, memory elements of a column each having a common strip-shaped semiconductor region and memory elements of a line each having a common conducting path.

3. A method for operating a memory element formed of a doped first conductivity type semiconductor substrate, an insulating layer on the substrate having thick and thin film regions, a strip-shaped second conductivity type semiconductor region in the substrate and running along a surface thereof below the insulating layer, a conducting path on the insulating layer running obliquely to the strip-shaped region and over the thin film region adjacent an edge of the strip-shaped region, an island-shaped semiconductor region of first conductivity type within the strip-shaped region and located more closely to the edge of the strip-shaped region adjacent the thin film area, comprising the steps of:

(a) for preparing the write-in of information
   (i) depleting the strip-shaped semi-conductor region with respect to majority carriers by applying a potential as a bias voltage thereto;
   (ii) further raising the potential of the strip-shaped semiconductor region until the majority carriers have drained out of the island-shaped semiconductor region into the substrate;
   (iii) lowering the potential of the strip-shaped semiconductor area to such an extent that a potential well arises in the island-shaped semi-conductor region;
(b) for writing-in of a digital information of a first type lowering the potential of the strip-shaped semiconductor region and lowering the voltage being applied to the conducting path so that majority carriers flow from the substrate covered by the thin film region via the strip-shaped semiconductor region into the island-shaped semiconductor region;
(c) for writing-in digital information of a second type lowering the potential of the strip-shaped semiconductor region and applying a high voltage to the conducting path so that underneath the thin film region a potential barrier arises which prevents a flowing of the majority carriers from the substrate into the island-shaped semiconductor region; and
(d) that for the storage of the information which is written-in, the potential of the strip-shaped semiconductor region is again raised to such an extent that no charge exchange occurs between the island-shaped semiconductor region and the substrate.

4. A method according to claim 3 wherein for read-out of the stored information, applying a low voltage to the conducting path and raising the potential of the strip-shaped semiconductor region to such an extent that a charge which is present where applicable in the island-shaped semiconductor region drains into the substrate and is evaluated in the form of a potential change at a substrate connection.

5. A method according to claim 3 wherein for the read-out of the stored information, applying a low voltage to the conducting path and raising the potential of the strip-shaped semiconductor region to such an extent that a charge, where applicable, which is present in the island-shaped semi-conductor region drains into the substrate and a change in potential which arises in the case of such a draining is evaluated in the strip-shaped semiconductor region.

6. A memory element comprising: a substrate of first conductivity type having a major surface; an insulating layer on the major surface, said insulating layer having a thick film portion and a thin film portion; a strip-shaped semiconductor region of second conductivity type in the substrate and running along the major surface thereof; an island-shaped semiconductor region within the strip-shaped region and of first conductivity type; a conducting path on the insulating layer running cross-wise to the strip-shaped region and having a portion approaching the substrate over the thin insulating layer portion adjacent one longitudinal edge of the strip-shaped region; and the island-shaped region being positioned at the major surface of the substrate and more closely approaching an edge of the strip-shaped region adjacent the thin layer portion than an opposite edge of the strip-shaped region.

* * * * *